United States Patent
Herbert

(10) Patent No.: US 8,643,380 B1
(45) Date of Patent: Feb. 4, 2014

(54) METHOD AND APPARATUS FOR REDUCING SHOCK AND ARC-FLASH HAZARDS IN POWER DISTRIBUTION SYSTEMS

(76) Inventor: Edward Herbert, Canton, CT (US)

( * ) Notice: Subject to any disclaimer, the term of this patent is extended or adjusted under 35 U.S.C. 154(b) by 275 days.

(21) Appl. No.: 13/184,478

(22) Filed: Jul. 15, 2011

Related U.S. Application Data

(60) Provisional application No. 61/364,481, filed on Jul. 15, 2010.

(51) Int. Cl.
*G01R 31/02* (2006.01)
*H04B 3/46* (2006.01)

(52) U.S. Cl.
USPC .......................................... 324/541; 324/544

(58) Field of Classification Search
USPC ................. 324/541, 539, 544, 543, 537, 500; 439/114, 212, 213, 251, 949
See application file for complete search history.

(56) References Cited

U.S. PATENT DOCUMENTS

| | | | | | |
|---|---|---|---|---|---|
| 4,282,479 | A | * | 8/1981 | Deboo et al. | 324/540 |
| 4,401,844 | A | * | 8/1983 | Fleuret | 174/72 B |
| 4,777,432 | A | * | 10/1988 | Doemens et al. | 324/459 |
| 5,627,723 | A | * | 5/1997 | Hageli et al. | 361/602 |
| 7,722,372 | B2 | * | 5/2010 | Matsumoto et al. | 439/213 |
| 2010/0110616 | A1 | * | 5/2010 | Edel | 361/642 |

* cited by examiner

*Primary Examiner* — Hoai-An D Nguyen

(57) ABSTRACT

It is known to insulate bus bars to reduce shock and arc-flash hazards. However, failed or damaged insulation may not be noticed, possibly presenting a greater hazard as it is unexpected and therefore not prepared for. A metal cladding at earth ground enhances the safety to personnel and reduces the likelihood of a more serious line to line arc-flash. Still better is the use of a guard conductor intermediate between the hot conductor and the earth ground insulated from both. Not only does it introduce an additional layer of insulation, it also provides a way to continuously monitor the integrity of the insulation. A resistor divider establishes the nominal voltage on the guard conductor. A departure from nominal voltage indicates a potential fault. The guard conductor can also be used as a node for connecting other sensors, or one of the insulation layers may be of thermally sensitive polymer, to detect hot spots.

8 Claims, 3 Drawing Sheets

METHOD AND APPARATUS FOR REDUCING SHOCK AND ARC-FLASH HAZARDS IN POWER DISTRIBUTION SYSTEMS

CROSS REFERENCE TO RELATED APPLICATIONS

This application claims priority to a provisional patent application Ser. No. 61/364,481 filed Jul. 15, 2010 and entitled "Method and Apparatus for Reducing Shock and Arc-flash Hazards in Power Distribution Systems." This patent application is incorporated herein by reference.

BACKGROUND OF THE INVENTION

In the quest for greater efficiency, there is a move to using higher voltage for power distribution in data-centers and like installations. Presently, data-centers usually distribute power as 3-phase 208 V ac or possibly 3-phase 240 V ac, the latter being more common abroad. Telecom centers usually distribute power as 48 V dc. 48 V dc is safe both for shock hazard and arc-flash. The voltage necessary to sustain an arc is in the order of 60 V dc. 208 V ac is generally considered not susceptible to arc-flash if sourced from a transformer of 125 kVA or less. 208 V ac is high enough to be a shock hazard, and ground fault (gfi) breakers are often used to reduce the risk. At higher currents, gfi breakers are not available.

Now, 380 V dc, as split plus and minus 190 Vdc is being considered for power distribution, as is 480 V ac 3-phase, as examples, not limitations. Both voltages are well above the threshold at which arc-flash becomes an issue, and both are high enough to present a serious shock hazard.

It is well known to use insulation to reduce the risk of shock, but many parts of a power distribution circuit customarily are not insulated, particularly the bus bars in distribution panels and switch gear. It is known but not widely practiced to use insulated bus bars to reduce the risk of arc-flash.

Arc-flash may be initiated by an inadvertent short circuit, but another common cause is a deteriorating connection. As the resistance of the connection increases, heat is generated, which can result in a degenerating situation resulting in failure of the connection. This may be accompanied by high heat and arcing, which can then arc to ground or another conductor as an arc-flash incident.

SUMMARY OF THE INVENTION

Fully insulated conductors in switch gear, power distribution panels and the like are effective for reducing the risk of arc-flash and shock as long as the integrity of the insulation is good. Damaged insulation may present a greater hazard, as the electrician or other personnel may be unaware of the risk and may not take even minimal precautions.

As a first defense, bus bars and other conductors may have a metal cladding on top of the insulation, with the metal cladding at earth ground potential. This provides an added layer of protection due to the strength of the metal cladding, and if damage occurs, the resulting short circuit would likely trip protective devices.

Even better is to provide continuous self-test of the insulation. This is accomplished by using a guard conductor between the hot conductor and the earth grounded metal cladding. Of course, the guard conductor is separated from the hot conductor and the earth grounded metal cladding by insulation, so the build up is hot conductor, insulation, guard, insulation, earth ground cladding. Nominally, the guard conductor is at an intermediate voltage, and that intermediate voltage can be stabilized with a resistor divider. If either layer of insulation is degraded to the point of being more conductive, the voltage of the guard conductor will change, and that change can be detected by a sensor. A slight change may flag a need for maintenance, while a larger change may trip protective devices.

The guard conductor may also serve as a node for collecting signals from other sensors. As an example, excessive heat may indicate a deteriorating connection, an arc-flash hazard. Thermistors can sense hot spots. If a thermistor is connected from the guard conductor to the earth ground, when cool, its resistance is too high to have significant effect on the guard conductor voltage. When hot, its resistance is sufficiently low to pull the guard conductor voltage below a threshold, indicating a need for maintenance. If extreme, it may trip a protective device.

As an alternative, one of the layers of insulation may be temperature sensitive, a thermally sensitive polymer. A hot spot results in lower resistance locally, just as if a thermistor were located there.

DETAILED DESCRIPTION

Figure 1:
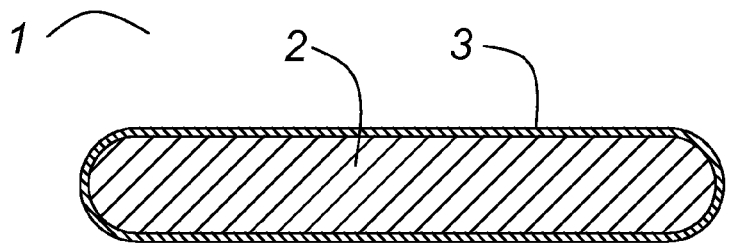
FIG. 1 shows a prior art bus bar with a layer of insulation on it.

FIG. 1 shows a prior art insulated bus bar 1 comprising a hot conductor 2 surrounded by a layer of insulation 3.

Figure 2:
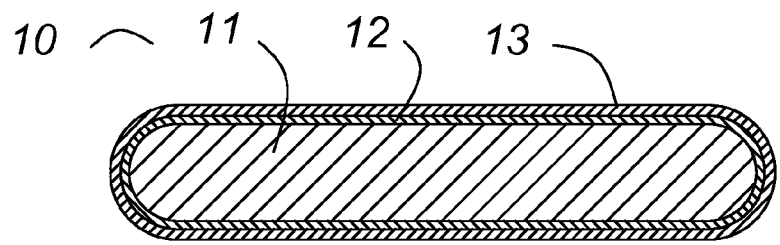
FIG. 2 shows a bus bar with a layer of insulation and a metal cladding.

FIG. 2 shows an insulated bus bar 10 comprising a hot conductor 11 surrounded by a layer of insulation 12. There is a layer of metal cladding 13 surrounding the layer of insulation 12. Preferably, the metal cladding 13 is at earth ground potential so that anyone touching it will not receive a shock. The metal cladding 13 at earth ground potential also makes a line to line arc-flash to another conductor very unlikely. If an arc-flash occurs, the earth grounded metal cladding 13 will draw the arc preferentially so that it is a less dangerous and more easily detected line to earth ground arc-flash.

Figure 3:
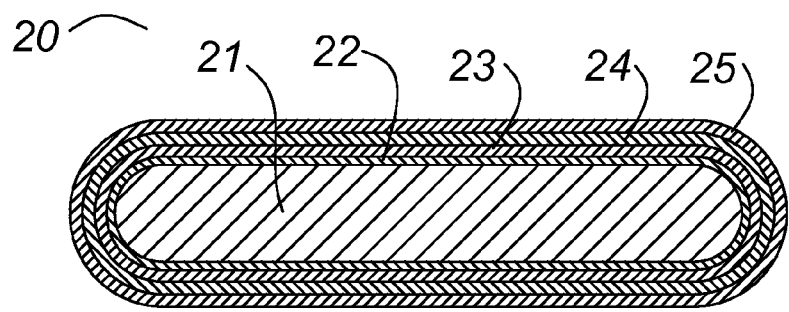
FIG. 3 shows that there may be two layers of insulation sandwiching a guard conductor between the bus bar and the outer metal cladding.

FIG. 3 shows an insulated bus bar 20 comprising a hot conductor 21 surrounded by a first layer of insulation 22. There is a guard conductor 23 surrounding the first layer of insulation 22, and a second layer of insulation 24 surrounding the guard conductor 23. Finally, metal cladding 25 surrounds the second layer of insulation 24.

It is preferred that the hot conductor 21 have rounded corners and edges to avoid points or edges of higher electric field and to reduce the risk of insulation puncture if struck. The first layer of insulation 22 may be deposited by any of several methods. Electrostatic deposition is preferred, as it provides an even coating of good integrity that will actually be somewhat thicker if any location has an elevated electric field. Alternatives are dipping, spraying, and other methods of e-coating.

Obviously the first layer of insulation 22 must be interrupted to make connections. Where possible, it is preferred that fixed connections be made prior to coating so that the coating covers the joint as well. For movable connections, such as where a circuit breaker or cable attaches, it is preferred that the connection be designed with an insulating cover and that it further be designed so that when installed, the insulating cover completely covers all exposed metal.

The guard conductor 23 may be deposited on the first layer of insulation 22 using methods borrowed from the printed wiring board industry. It is common to deposit a thin seed layer of conductive material using electroless deposition, then plate copper upon the layer seed layer of conductive material to the desired thickness. Other methods are equivalent, such as vacuum deposition, sputtering, conductive polymers, etc.

The second layer of insulation 24 may be deposited just as the first layer of insulation 22. The metal cladding 25 may be deposited as was the guard conductor 23, though it is preferred that it be plated more to be thicker so that it can carry a fault current if necessary until a protective device can open.

Figure 4:
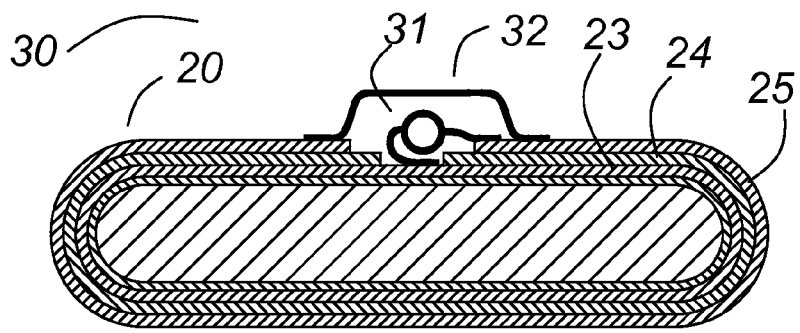
FIG. 4 shows that a sensor such as a thermistor may connect between the guard conductor and the outer metal cladding.

FIG. 4 shows an insulated bus bar 30 which is the insulated bus bar 20 of FIG. 3 further comprising a sensor 31 connected between the guard conductor 23 and the metal cladding 25. A cover 32 covers the sensor 31 and the opening in the metal cladding 25. The sensor 31 may be a thermistor, as an example, not a limitation, to sense local elevated temperature. Whatever it senses, the sensor 31 shows an abnormal condition by presenting a lower resistance, thereby altering the voltage on the guard conductor 23, as explained further below.

Figure 5:
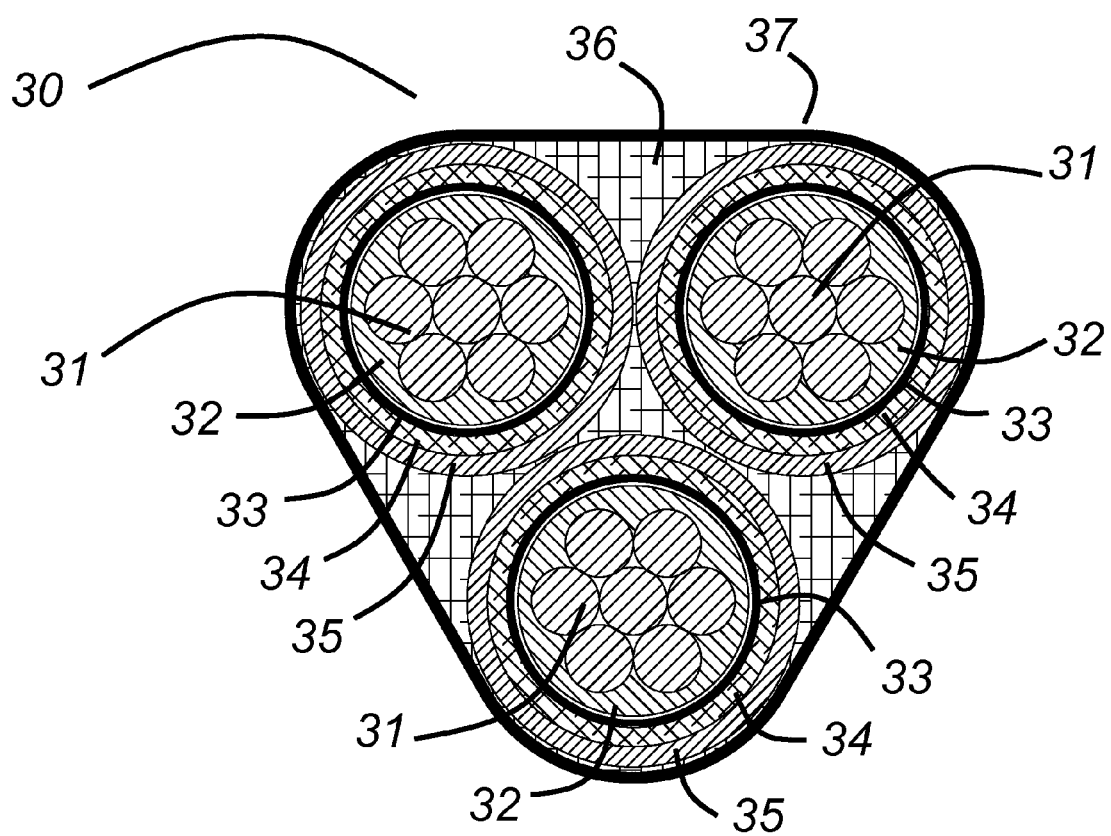
FIG. 5 shows a three conductor cable. Each of the conductors has a guard conductor and an outer braid or cladding at earth ground.

FIG. 5 shows a three conductor cable 30 as might be used for 3-phase ac voltage. A similar two conductor cable may be used for dc or single phase ac. Three conductors 31-31 are surrounded by first insulation layers 32-32. Next, there are guard conductors 33-33 and second layers of insulation 34-34. Outer metal braids 35-35 (or their equivalents) are at earth ground. The outer metal braids 35-35 are a first defense against a short circuit caused by an object penetrating or crushing the cable 30, almost certainly causing a fault current between one of the conductors 31 and its outer metal braid 35. This prevents electrifying the penetrating object. Finally, there is optional insulating filler 36 and an optional outer insulating jacket 37.

As an alternative to the sensor 31 of FIG. 4, and as an alternative construction for the cable 30 of FIG. 5, one of the layers of insulation 22, 24, 32 or 34 may be a thermally sensitive polymer. It is preferred that it be the second layer of insulation 24 or 34. If there is a local hot spot, the thermally sensitive polymer becomes conductive and alters the voltage on the guard conductor 25 or 33. It is known to use thermally sensitive polymer to detect hot spots in heaters such as electric blankets or car seat heaters and the like.

Figure 6:
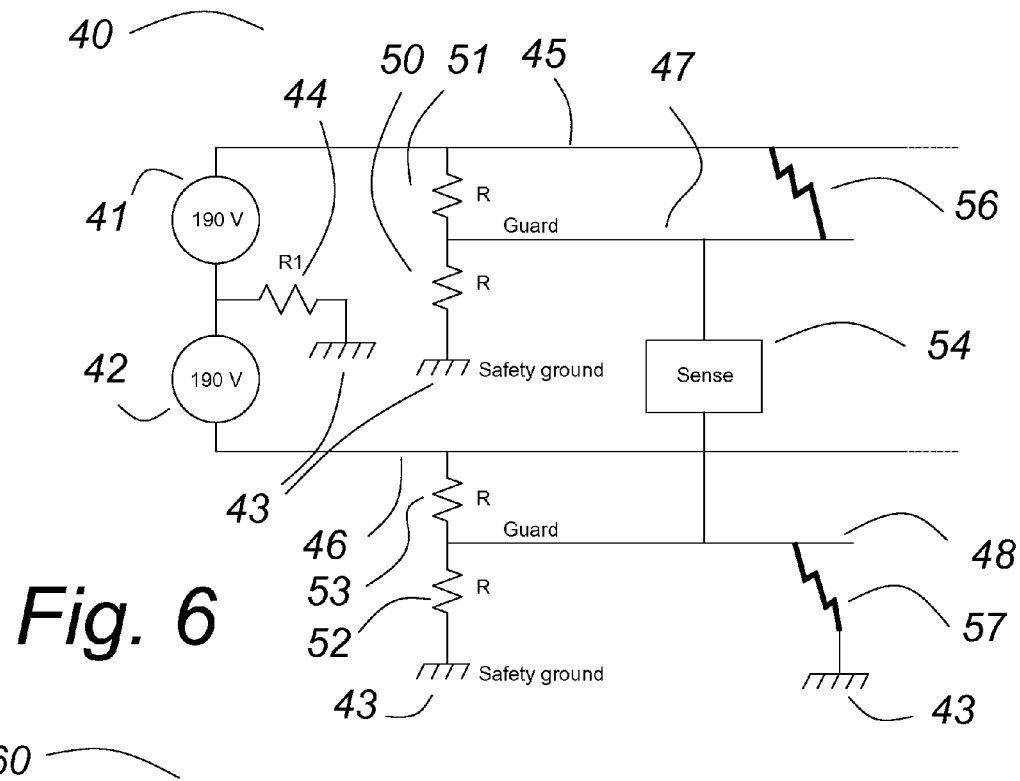
FIG. 6 shows that a resistor divider may establish a nominal guard conductor voltage. A sense control determines if the guard conductor voltage is out of limit.

FIG. 6 shows a power distribution system 40, which is a dc power distribution system as an example, not a limitation. First and second voltage sources 41 and 42 provide voltage respectively to power busses 45 and 46. The common connection between the voltage sources 41 and 42 may be connected to earth ground 43. It may be a direct connection to earth ground 43, or it may be through a resistor 44 as shown.

Guard conductors 47 and 48 respectively surround the power busses 45 and 46, it being understood that the guard conductors 47 and 48 are insulated both from the power busses 45 and 46 and from the earth ground 43, as in FIGS. 3 through 5. Resistor dividers comprising resistors 50 to 53 determine the nominal voltages on the guard conductors 47 and 48, as would be well understood one skilled in the art of electrical engineering. A sense controller 54 monitors the voltage on the guard conductors 47 and 47 and provides a signal that may alert an operator to a minor out of tolerance condition or operate a protective device (not shown) to open the circuit for a severe out of tolerance condition.

Hypothetical shorts are shown by the cartoon arcs 56 and 57, representing, respectively, a short through the first layer of insulation, hot conductor 45 to the guard conductor 47 and the second layer of insulation, the guard conductor 48 to the earth ground 43.

Figure 7:
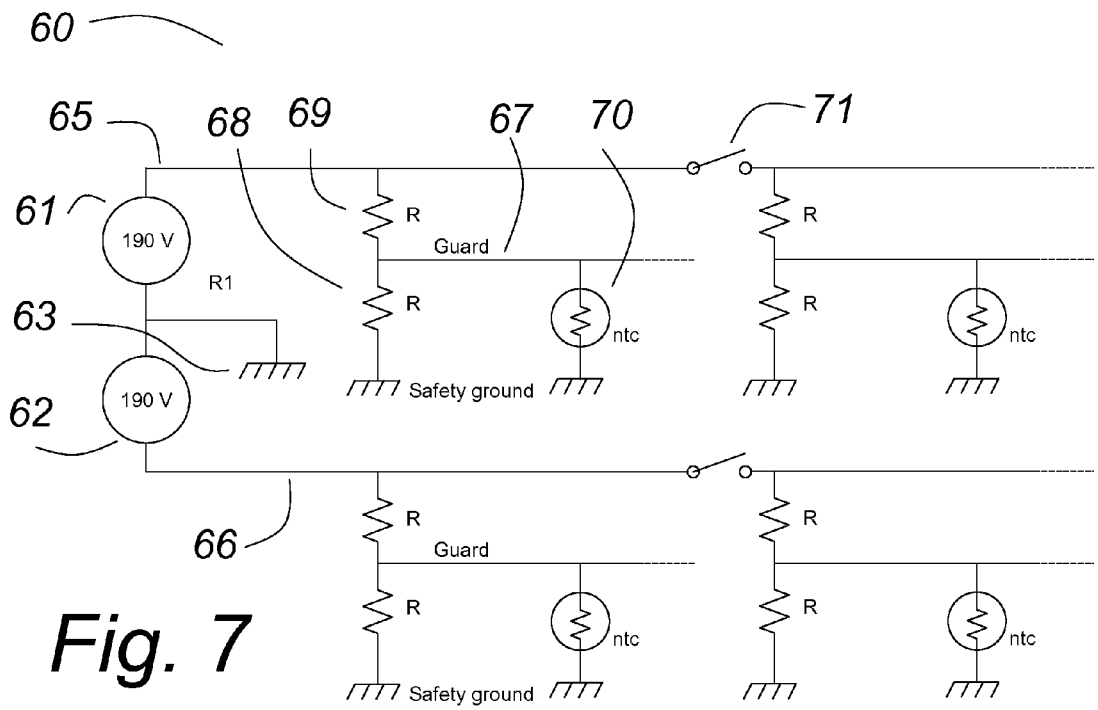
FIG. 7 shows connecting thermistors to the guard conductor. It also shows that if a switching device interrupts a hot conductor, the guard conductors must be separate.

FIG. 7 shows a power distribution system 60, which is a dc power distribution system as an example, not a limitation. First and second voltage sources 61 and 62 provide voltage respectively to power busses 65 and 66. The common connection between the voltage sources 41 and 42 is connected to earth ground 63. It may be a direct connection to earth ground 43 as shown, or it may be through a resistor as in FIG. 6.

A guard conductors 67 surrounds the power busses 65, it being understood that the guard conductors 67 is are insulated both from the power busses 65 and from the earth ground 63, as in FIGS. 3 through 5. A resistor divider comprising resistors 68 and 69 determine the nominal voltages on the guard conductors 67, as would be well understood one skilled in the art of electrical engineering.

A sensor 70, shown as a negative temperature coefficient (ntc) thermistor as an example, not a limitation, is connected between the guard conductor 67 and earth ground 63. If there is a hot spot, the voltage on the guard conductor 67 is reduced relative to earth ground 63, as would be well understood by one skilled in electrical engineering. FIG. 7 shows other circuits and other sensors as well, not identified by reference designators as their function and operation is similar and they are sufficiently explained by comparison. However, if any of the other circuits are separated from the power busses 65 or 66 by a switch such as the switch 71, then the guard conductor for each segment must be separate, and a separate resistor divider is used. If this is not done, a load on the de-energized part of the circuit may pull down the voltage of the guard conductor, resulting in a false error.

DEFINITIONS

A thermally sensitive polymer is a polymer that normally has a high impedance suitable as an insulation layer but for which the impedances is reduced as the temperature rises.

"Means for establishing a nominal voltage on the guard conductor" is a resistive voltage divider or other voltage source having sufficient source impedance that the voltage will change if there is degradation of one of the layers of insulation.

"Means for detecting the voltage on the guard conductor" is a voltmeter, comparators, or other device capable of comparing the voltage on the guard conductor to the desired nominal voltage to determine if it is out of limit. "Detection of degradation of a layer of insulation" means detecting that the voltage on the guard conductor is out of limit. It may be a slight deviation, indicating a need for maintenance or it may be a serious deviation. "Detection" includes providing necessary signals and controls to take the appropriate action such as notification or operating a protective device.

A "hot spot temperature" is a region of elevated temperature. "Detection of a hot spot temperature" includes providing necessary signals and controls to take the appropriate action such as notification or operating a protective device.

The invention claimed is:

1. A bus bar having at least a first layer of insulation thereon for shock and arc-flash protection and a metal cladding at earth ground voltage further comprising a guard conductor and a second layer of insulation between the at least a first layer of insulation and the metal cladding,
   means for establishing a nominal voltage on the guard conductor,
   means for detecting the voltage on the guard conductor so as to provide detection of degradation of at least one of the at least a first layer of insulation and the second layer of insulation.

2. The bus bar of claim 1 wherein at least one of the at least a first layer of insulation and the second layer of insulation is of thermally sensitive polymer to provide detection of a hot spot temperature.

3. The bus bar of claim 1 further comprising at least a first sensor connected between the guard conductor and the metal cladding.

4. The bus bar of claim 3 wherein the at least a first sensor is a thermistor to provide detection of a hot spot temperature.

5. A cable having at least a first conductor with at least a first layer of insulation thereon for shock and arc-flash protection and an outer metal braid at earth ground voltage further comprising a guard conductor and a second layer of insulation between the at least a first layer of insulation and the outer metal braid,
   means for establishing a nominal voltage on the guard conductor,
   means for detecting the voltage on the guard conductor so as to provide detection of degradation of at least one of the at least a first layer of insulation and the second layer of insulation.

6. The cable of claim 5 wherein at least one of the at least a first layer of insulation and the second layer of insulation is of thermally sensitive polymer to provide detection of a hot spot temperature.

7. The cable of claim 5 further comprising at least a first sensor connected between the guard conductor and the outer metal braid.

8. The cable of claim 7 wherein the at least a first sensor is a thermistor to provide detection of a hot spot temperature.

* * * * *